United States Patent
Bagga

(10) Patent No.: US 11,329,613 B2
(45) Date of Patent: May 10, 2022

(54) AMPLIFIER

(71) Applicant: Novelda AS, Kviteseid (NO)

(72) Inventor: Sumit Bagga, Oslo (NO)

(73) Assignee: NOVELDA AS, Kviteseid (NO)

(*) Notice: Subject to any disclaimer, the term of this patent is extended or adjusted under 35 U.S.C. 154(b) by 0 days.

(21) Appl. No.: 16/760,218

(22) PCT Filed: Oct. 30, 2018

(86) PCT No.: PCT/GB2018/053133
§ 371 (c)(1),
(2) Date: Apr. 29, 2020

(87) PCT Pub. No.: WO2019/086853
PCT Pub. Date: May 9, 2019

(65) Prior Publication Data
US 2020/0336119 A1  Oct. 22, 2020

(30) Foreign Application Priority Data
Oct. 30, 2017 (GB) .................................... 1717857

(51) Int. Cl.
*H03F 1/56* (2006.01)
*H03F 3/19* (2006.01)

(52) U.S. Cl.
CPC ............... *H03F 1/565* (2013.01); *H03F 3/19* (2013.01); *H03F 2200/222* (2013.01); *H03F 2200/294* (2013.01); *H03F 2200/451* (2013.01)

(58) Field of Classification Search
CPC ...... H03F 1/565; H03F 3/19; H03F 2200/222; H03F 2200/294; H03F 2200/451
(Continued)

(56) References Cited

U.S. PATENT DOCUMENTS 6,172,563 B1  1/2001 Trask
9,800,273 B1  10/2017 Abdelhalem et al.
(Continued)

FOREIGN PATENT DOCUMENTS

CA       2149308 A1    11/1992
WO   WO 2010/007177 A1   1/2010
(Continued)

OTHER PUBLICATIONS

Homer, H., "Stability Analysis of Negative Resistance-Based Source Combining Power Amplifiers" Ph.D. thesis, California Polytechnic State University, San Luis Obispo, Jun. 2015. (Year: 2015).*
(Continued)

*Primary Examiner* — Hafizur Rahman
(74) *Attorney, Agent, or Firm* — Klarquist Sparkman, LLP

(57) ABSTRACT

An amplifier, including: an amplifying element, having a voltage input across a first terminal and a third terminal and a voltage controlled current path between a second terminal and the third terminal; and a trifilar transformer having a primary winding, a secondary winding and a tertiary winding; wherein the primary winding is connected to the third terminal, the secondary winding is connected to the first terminal and the tertiary winding is connected to the second terminal; wherein the primary winding and the secondary winding are mutually coupled in inverting relationship; wherein the primary winding and the tertiary winding are mutually coupled in non-inverting relationship; wherein the secondary winding and the tertiary winding are mutually coupled in inverting relationship; and wherein the tertiary winding is between the amplifier output and the second terminal.

14 Claims, 7 Drawing Sheets

(58) Field of Classification Search
USPC .................................................... 330/277
See application file for complete search history.

(56) References Cited

U.S. PATENT DOCUMENTS

| | | |
|---|---|---|
| 2007/0290745 A1 | 12/2007 | Vitzilaios et al. |
| 2014/0191800 A1 | 7/2014 | Jordan |
| 2014/0300424 A1 | 10/2014 | Taghivand |
| 2016/0164476 A1 | 6/2016 | Wang et al. |
| 2017/0179894 A1 | 6/2017 | Jin et al. |
| 2017/0230014 A1 | 8/2017 | Paulin |

FOREIGN PATENT DOCUMENTS

| | | |
|---|---|---|
| WO | WO 2013/085966 A1 | 6/2013 |
| WO | WO 2016/089579 A1 | 6/2016 |
| WO | WO 2017/074297 A1 | 5/2017 |

OTHER PUBLICATIONS

Chao-Chieh et al., "19.6 A 0.2V Trifilar-Coil DCO with DC-DC Converter in 16nm FinFet CMOS with 188dB FOM, 1.3kHz Resolution, and Frequency Pushing of 38MHz/V for Energy Harvesting Applications," 2017 IEEE International Solid-State Circuits Conference, Feb. 5, 2017, 3 pages.

International Search Report and Written Opinion for PCT/GB2018/053133, dated Jan. 28, 2019, 17 pages.

IPO Search Report under Section 17(5) for GB 1717857.5, dated Apr. 26, 2018, 4 pages.

Liscidini et al., "Common Gate Transformer Feedback LNA in a High IIP3 Current Mode RF CMON Front-End," Conference 2006, IFEE Custom Integrated Circuits, Sep. 1, 2006, pp. 25-28.

International Preliminary Report on Patentability for PCT/GB2018/053133, dated May 5, 2020, 8 pages.

Chang et al., "An Ultra-Low-Power Transformer-Feedback 60 GHz Low-Noise Amplifier in 90 nm CMOS," *IEEE Microwave and Wireless Components Letters*, vol. 22, No. 4, Apr. 2012, pp. 197-199.

EPO Official Letter for EP 18 800 269.5-1203, dated Dec. 10, 2021, 5 pages.

Li et al., "A 0.2V Trifilar-Coil DCO with DC-DC Converter in 16nm FinFET CMOS with 188dB FOM, 1.3kHz Resolution, and Frequency Pushing of 38MHz/V for Energy Harvesting Applications," *2017 IEEE International Solid-State Circuits Conference*, pp. 332-334.

Official Action (with English Translation) for Taiwan Application No. 107137940, dated Nov. 3, 2021, 18 pages.

Walling et al., "A $g_m$-Boosted Current-Reuse LNA in 0.18 µm CMOS," *IEEE Radio Frequency Integrated Circuits (RFIC) Symposium*, Jun. 2007, 4 pages.

\* cited by examiner

AMPLIFIER

CROSS REFERENCE TO RELATED APPLICATIONS

This is the U.S. National Stage of International Application No. PCT/GB2018/053133, filed Oct. 30, 2018, which was published in English under PCT Article 21(2), which in turn claims the benefit of Great Britain Application No. 1717857.5, filed Oct. 30, 2017.

The invention relates to amplifiers, in particular to low-noise amplifiers (LNAs) and more particularly to low-noise amplifiers employing reactive components as part of the impedance and/or noise-matching and gain-boosting mechanism.

There is a general desire to improve gain in amplifiers, especially in low-power RF receivers. However, as well as providing gain, it is also important that the LNA has a well-defined input impedance, so that it is power matched to the antenna for maximum power transfer between these two blocks in RF front-end. It will be appreciated that this is particularly important in LNAs working with already very low-levels input signals.

A basic common-gate (CG) LNA is shown in FIG. 2. The basic amplifying element of the amplifier 200 is a transistor $M_1$ which is biased in saturation by DC current source $I_{DC}$. Active gain is simply provided by the transconductance, $g_m$ of the transistor $M_1$, being defined as the ratio of output current to input voltage ($i_{out}/v_{in}$). As shown in FIG. 2, the gate of $M_1$ is AC grounded and kept at a constant DC voltage, while the input signal $RF_i$ is applied at the source, thus varying the gate-source voltage, and thereby producing a drain-source current. The output signal $RF_0$ is taken from the drain. For a CG-stage, output current is approximately equal to input current (i.e., intrinsic current gain is ≅1). Thus, the input impedance for a CG-stage is defined as:

$$Z_i = \frac{v_{in}}{i_{in}} = \frac{v_{in}}{i_{out}} \cong \frac{1}{g_m}$$

To set the input impedance at a certain value for impedance matching, $M_1$ must be selected to have an intrinsic transconductance of a specific value, thus also determining the gain (product of $g_m$ and the load impedance, $Z_L$) of the amplifier. This puts a limit on the gain of the amplifier. For example, to obtain an input impedance of 50Ω (typical impedance of an RF antenna), $M_1$ must have a transconductance of 20 milliamperes per volt (mA/V).

A modification of the CG-LNA of FIG. 2 uses a transformer to boost the transconductance, $g_m$ of the CG-stage, and with it the gain of the amplifier. This modification is shown in FIG. 3. The amplifier 300 has the same basic arrangement as in FIG. 2, except that an inverting transformer 310 is provided having a primary winding $L_p$ and a secondary winding $L_s$. The primary winding $L_p$ is connected to the source of transistor $M_1$, and the secondary winding $L_s$ is connected to the gate in inverting relationship such that the primary winding $L_p$ senses the input voltage, and the secondary winding $L_s$ applies an inverted and proportional voltage to the gate. Therefore, as the input voltage drops, the gate voltage increases, and vice versa. Thus, the gate-source voltage is passively amplified by the transformer 300 which in turn, combined with the intrinsic transconductance of $M_1$, results in a larger overall transconductance. The overall gain depends on the characteristics of the transformer 300, in particular its turns ratio, n and its coupling coefficient, k. For an ideal transformer, the coupling coefficient would be 1, but in practice will always be less than 1, typically 0.7-0.9 (moderate-to-strong mutual coupling). The input impedance of this amplifier 300 is defined as:

$$Z_i \cong \frac{1}{g_m(1+nk)}$$

The transconductance of this amplifier 300 is improved by a factor (1+nk). However, from an impedance matching point of view, in order to match a specific impedance, such as a 50Ω antenna, it is still necessary to specifically set the intrinsic transconductance of the transistor $M_1$ at a specific level. Comparing the amplifier 200 of FIG. 2 with the amplifier 300 of FIG. 3, the $g_m$-boosted amplifier 300 can use a smaller transistor $M_1$ with lower transconductance, and/or can save power with a lower DC current. However, the circuit 300 is still constrained by the input impedance such that there is no overall improvement in signal gain. As an example, for an ideal transformer 310 (with n=1 and k=1), to match an input impedance of 50Ω, the intrinsic transconductance of $M_1$, $g_m$, has to be reduced from 20 mA/V to 10 mA/V. The increased passive gain from the transformer 310 has to be exactly offset by a reduced transconductance of transistor $M_1$.

Another amplifier 400 is shown in FIG. 4. In this circuit the amplifier 400 uses a transformer 410 having a primary winding $L_p$ and a secondary winding $L_s$ in a positive (current) feedback arrangement. The primary winding $L_p$ of the transformer 410 is connected to the drain of transistor $M_1$ and the secondary winding $L_s$ is connected to the source. The primary winding $L_p$ senses the current at the output (drain) and applies this (non-inverted) at the input (source) in parallel to the input signal, thereby increasing the current through the transistor $M_1$, and thus increasing the overall current gain of the amplifier 400. The input impedance of this amplifier 400 is defined as:

$$Z_i \cong \frac{1}{g_m\left(1-\frac{k}{n}\right)}$$

where k is the coupling coefficient, n is the turns ratio, and k/n is the effective turns ratio of the transformer. While the overall current gain of the amplifier 400 is greatly improved (a much higher current gain can be obtained for a given input voltage), when viewed from an impedance matching perspective the circuit 400 again has limitations. This time, the factor (1−k/n) in the above equation means that for a given $g_m$, the input impedance is increased. To compensate for this, and thereby achieve impedance matching, the intrinsic transconductance of the transistor $M_1$ has to be increased. As an example, for a transformer with n=1 and k=0.9, to match an input impedance of 50Ω, the intrinsic transconductance of $M_1$, $g_m$ has to be set at 200 mA/V. Thus, while the amplifier 400 results in a higher current gain (10), the increased transconductance requires higher power consumption for impedance matching, which is far from ideal, especially in applications for portable and/or battery powered devices.

According to the invention there is provided an amplifier, comprising:

an amplifying element, having a voltage input across a first terminal and a third terminal and a voltage controlled current path between a second terminal and the third terminal; and a trifilar transformer having a primary winding, a secondary winding and a tertiary winding;

wherein the primary winding is connected to the third terminal, the secondary winding is connected to the first terminal and the tertiary winding is connected to the second terminal;

wherein the primary winding and the secondary winding are mutually coupled in inverting relationship;

wherein the primary winding and the tertiary winding are mutually coupled in non-inverting relationship;

wherein the secondary winding and the tertiary winding are mutually coupled in inverting relationship; and wherein the tertiary winding is between the amplifier output and the second terminal.

The trifilar transformer arrangement provides more than one gain mechanism by which the overall transconductance/gain of the circuit is increased. Firstly, the voltage feedforward arrangement provided by the primary winding and the secondary winding increases the gain by sensing the voltage at the amplifier input on the third terminal and applying it with inversion to the voltage input at the first terminal. This increases the voltage across the first and third terminals, which in turn controls the magnitude of the current through the voltage controlled current path, thereby increasing the transconductance of the amplifying element. At the same time, the positive current feedback provided by the mutual coupling of the tertiary winding and the primary winding causes a second gain mechanism which increases current flow through the voltage controlled current path, and thus also provides increased current gain of the amplifier.

A third gain mechanism is also in operation due to the mutual coupling of the tertiary winding and the secondary winding. The voltage sensed by the tertiary winding is coupled in positive feedback arrangement to the voltage input on the first terminal. However, it should be noted that this third gain mechanism is only desirable if it can be kept at a low enough level. If the mutual coupling between the secondary and tertiary windings is too high, then there is a risk of instability and the circuit oscillating. However, at a sufficiently low level, this third gain mechanism is beneficial, providing added overall gain. More specifically, in order to ensure stability of the amplifier when its gain is greater than or equal to 1 (in the frequency range from dc up to the transit frequency), the effective turns ratios of each pair of windings (i.e. $n_1/k_1$, $n_2/k_2$ and $n_3/k_3$) should be chosen such that the real part of the input impedance is positive and the real part of the output impedance is positive. This may be achieved by selecting the effective turns ratios of each pair of windings such that the phase difference between the first terminal and the third terminal (gate and source in the case of a single transistor) is within a range of 120-240 degrees (i.e. 180+/−60 degrees), preferably within a range of 150-210 degrees (i.e. 180+/−30 degrees).

In some embodiments the trifilar transformer may be arranged such that the mutual coupling between the secondary winding and the tertiary winding is lower than the mutual coupling between the primary winding and the secondary winding and/or lower than the mutual coupling between the primary winding and the tertiary winding. By keeping the secondary-tertiary mutual coupling lower than that of the other windings, the amplifier is more likely to be stable (although stability is not guaranteed across all choices of $n_i$, $k_i$). The coupling coefficients of the various windings can be adjusted by transformer design, e.g. by adjusting the relative sizes and/or positioning of the windings.

Thus, the amplifier provides an excellent overall gain. However, an additional and significant benefit of this arrangement is that the input impedance of the circuit can be adjusted for impedance matching without adversely impacting the gain or putting undesirable constraints on the intrinsic transconductance of the amplifying element. The input impedance of the amplifier is defined as:

$$Z_i \cong (g_m(1+n_{P,S}k_{P,S}+n_{T,S}k_{T,S})(1-k_{T,P}/n_{T,P}))$$

where:

$n_{P,S}$ is the turns ratio of the primary and secondary windings;

$n_{T,S}$ is the turns ratio of the tertiary and secondary windings;

$n_{T,P}$ is the turns ratio of the tertiary and primary windings;

$k_{P,S}$ is the mutual coupling coefficient of the primary and secondary windings;

$k_{T,S}$ is the mutual coupling coefficient of the tertiary and secondary windings;

$k_{T,P}$ is the mutual coupling coefficient of the tertiary and primary windings;

$g_m$ is the intrinsic transconductance of the amplifying element.

In the above equation, it can be seen that there is a factor introduced by the transformer which is dependent on the three mutual couplings. Advantageously, this factor is the product of two terms. The first term, $(1+n_{P,S}k_{P,S}+n_{T,S}k_{T,S})$ is always greater than 1 and the second term, $(1-k_{T,P}/n_{T,P})$ is always less than 1 (although care should be taken that this second term remains positive, which will for example always be the case where n is greater than or equal to 1). Therefore, by careful selection of the turns ratios and coupling coefficients the input impedance can be matched to a particular value, while still having excellent gain and without having to use an amplifying element with particularly large transconductance, and thus, power consumption.

In some preferred embodiments the primary winding is mutually coupled to each of the secondary winding and the tertiary winding, and the secondary winding and the tertiary winding are substantially not coupled to each other. This arrangement is preferred where the secondary-tertiary coupling is entirely unwanted and should be minimized or entirely eliminated. However, as discussed above, in many applications some secondary-tertiary coupling can be tolerated and is even beneficial. As discussed above, although not a guarantee of amplifier stability, a reduced mutual coupling coefficient between the secondary and tertiary windings is a good indicator in many embodiments. Therefore, in some preferred embodiments the mutual coupling coefficient between the secondary and tertiary windings is less than the mutual coupling coefficient between the primary and secondary windings and/or less than the mutual coupling coefficient between the primary and tertiary windings. More preferably the mutual coupling coefficient between the secondary and tertiary windings is less than two thirds, preferably less than half, more preferably less than one third of the mutual coupling coefficient between the primary and secondary windings and/or the mutual coupling coefficient between the primary and tertiary windings.

Perfect coupling between the primary winding and each of the secondary and tertiary winding is normally not achievable, especially in on-chip transformers where the size and shape of the windings are constrained by the fabrication processes, but strong coupling can be obtained, e.g. a coupling coefficient of around 0.8-0.9 may be possible in some embodiments. The magnitude of the mutual coupling coefficient between the secondary winding and the tertiary winding that may be used with a stable amplifier will depend on the particular circuit arrangement, but in some particularly preferred embodiments the mutual coupling coefficient between the secondary winding and the tertiary winding is less than 0.4, preferably less than 0.3, more preferably less than 0.2, yet more preferably less than 0.1.

The three windings of the trifilar transformer may be arranged in any of a number of different configurations. For example, the windings may be concentric, interwound or stacked or any combination of these. For on-chip transformers, the windings are formed in thick (or ultra-thick) metal layers, and in such arrangements the windings may all be in a single layer, two stacked layers or even three stacked layers. In some particularly preferred embodiments the primary winding, the secondary winding and the tertiary winding are all concentric and the primary winding separates the secondary winding from the tertiary winding. By placing the primary winding in between, the secondary winding and the tertiary winding, there will be stronger coupling between the primary and secondary and between the primary and tertiary than there will be between the secondary and tertiary as the secondary and tertiary windings have the greatest separation.

In other embodiments the primary winding may be interwound with either the secondary winding or the tertiary winding. The other of the secondary winding and the tertiary winding may be concentric with the interwound windings.

In other embodiments the trifilar transformer may be formed in two metal layers with the primary winding in a different layer from one of the secondary winding and the tertiary winding and the primary winding being formed in the same layer and concentric with the other of the secondary winding and the tertiary winding.

As discussed above, in some cases it may be desirable to reduce the mutual coupling of the secondary and tertiary windings to the maximum extent possible, practically to zero if possible. This may be achieved by appropriate shaping of the windings. Therefore, in some preferred embodiments the secondary winding is shaped so as to have near-zero mutual coupling with the tertiary winding. This will of course depend on the relative shapes of both the secondary and tertiary windings. Near-zero mutual coupling may be considered in relative terms when compared with the mutual coupling of the other winding pairs (e.g. less than a fifth of those). However, by way of example in some embodiments, e.g. where the other winding pairs have mutual couplings of around 0.5-0.7, near-zero mutual coupling may be taken to mean a mutual coupling of less than 0.1, preferably less than 0.05. One configuration that cancels the coupling is where one winding is a loop winding and the other is a figure-of-eight winding such that the coupling along one half of the 'eight' cancels the coupling along the other half of the 'eight'. A third winding can be arranged to couple with both of these windings. This arrangement is beneficial in differential amplifier embodiments (when driven symmetrically, impedances are the same on the two ports of each winding).

While it will be appreciated that the following is not limiting on the invention, in some preferred embodiments the amplifying element has an intrinsic transconductance of between 10 mA/V and 100 mA/V, preferably between 20 mA/V and 50 mA/V. With the architecture described here, the amplifier can obtain high gain while keeping the intrinsic transconductance of the amplifying element within these more normal and optimal ranges while also achieving impedance matching.

Although it will be appreciated that the principles described above may apply to any amplifying means, the amplifying element is preferably a transistor. For example, the amplifying element may be a number of transistors or other components connected together to form an amplifying circuit. However, in certain preferred embodiments a single transistor is used as the amplifying element. The circuit described here is particularly advantageous in providing a simple amplifier with high gain and impedance matching in a simple circuit with a single transistor as the main amplifying element. The transistor may be any type of transistor such as a bipolar junction transistor (BJT), but more conveniently the transistor may be a FET, preferably a MOSFET.

The FET is preferably arranged in a common-gate configuration. It will be appreciated that in a BJT arrangement, this equates to a common-base configuration.

In particularly preferred embodiments where the amplifying element is a FET, the primary winding is connected to the FET's source, the secondary winding is connected to the FET's gate and the tertiary winding is connected to the FET's drain.

According to another aspect, the invention provides a method of amplifying a signal with an amplifying element, the amplifying element comprising a voltage input across a first terminal and a third terminal and comprising a voltage controlled current path between a second terminal and the third terminal, the method comprising:
  applying the signal to a third terminal of the amplifying element;
  sensing, with a primary winding of a trifilar transformer, a voltage at the third terminal;
  coupling with inversion at least a part of said sensed voltage from the third terminal via a secondary winding of the trifilar transformer to the first terminal of the amplifying element;
  sensing, with a tertiary winding of a trifilar transformer, a current at the second terminal;
  coupling without inversion at least a part of said sensed current from the second terminal via a tertiary winding of the trifilar transformer to the third terminal of the amplifying element; and
  outputting an amplified signal from an output node located such that the tertiary winding is between the output node and second terminal.

It will be appreciated that all of the preferred and optional features discussed above may also be applied correspondingly to the method of operation.

Certain preferred embodiments of the invention will now be described, by way of example only, and with reference to the accompanying drawings in which.

Figure 1:
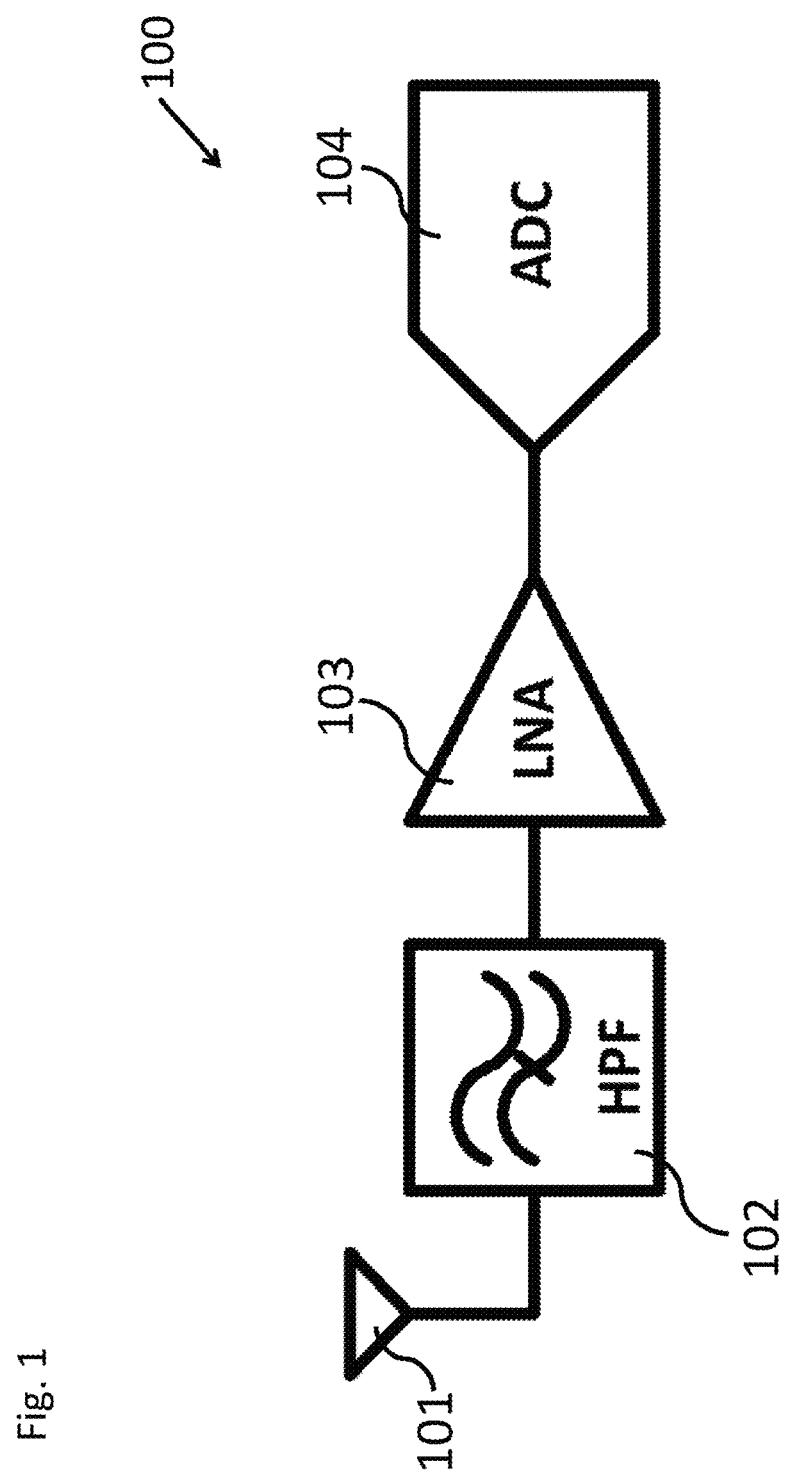
FIG. 1 shows a basic block diagram of a direct-RF sampling receiver front-end suitable for wideband signal processing.

FIG. 1 depicts a typical direct-RF sampling receiver front-end 100 for a wideband receiver operating for example, in the 6 to 8.5 GHz band. Antenna 101 receives a RF signal and passes it to high-pass filter 102 which rejects signals below about 6 GHz (and which may have a high rejection notch at around 5.1 to 5.8 GHz, although it will be appreciated that these numbers are provided purely by way of example). The output of high-pass filter 102 feeds to the input of low-noise amplifier 103 which provides gain for the signal of interest across the operating band of 6 to 8.5 GHz. The output of low-noise amplifier 103 is then fed to an analogue-to-digital converter (ADC) 104 that finally digitizes the RF signal.

Figure 2:
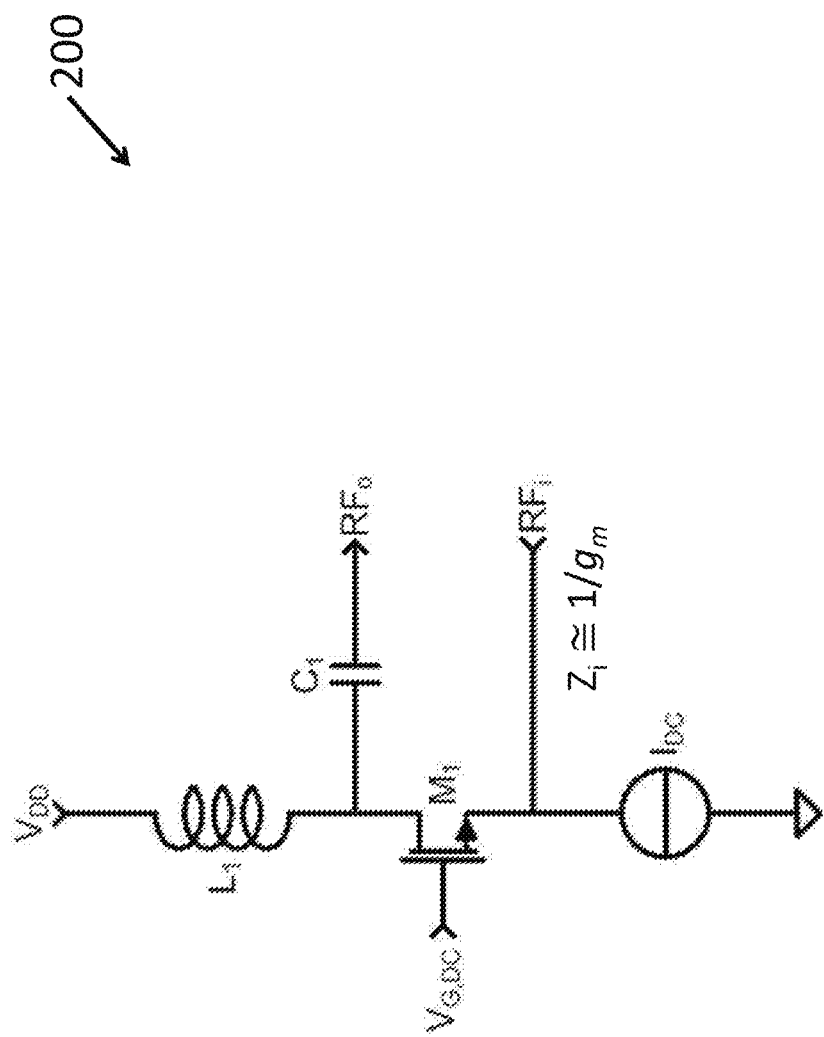
FIG. 2 shows a basic common-gate low-noise amplifier (LNA)
Figure 3:
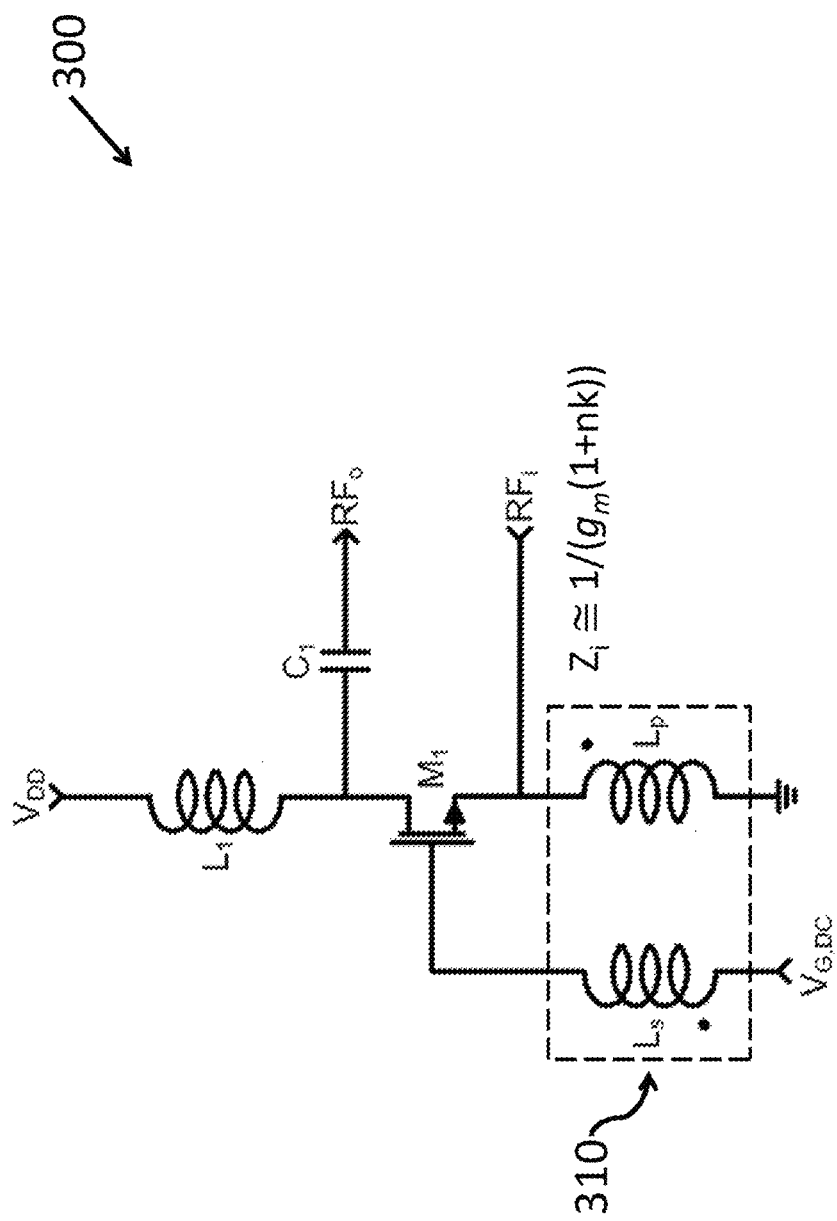
FIG. 3 shows a modified common-gate LNA using a transformer to boost the transconductance of the amplifier through a voltage feedforward arrangement.
Figure 4:
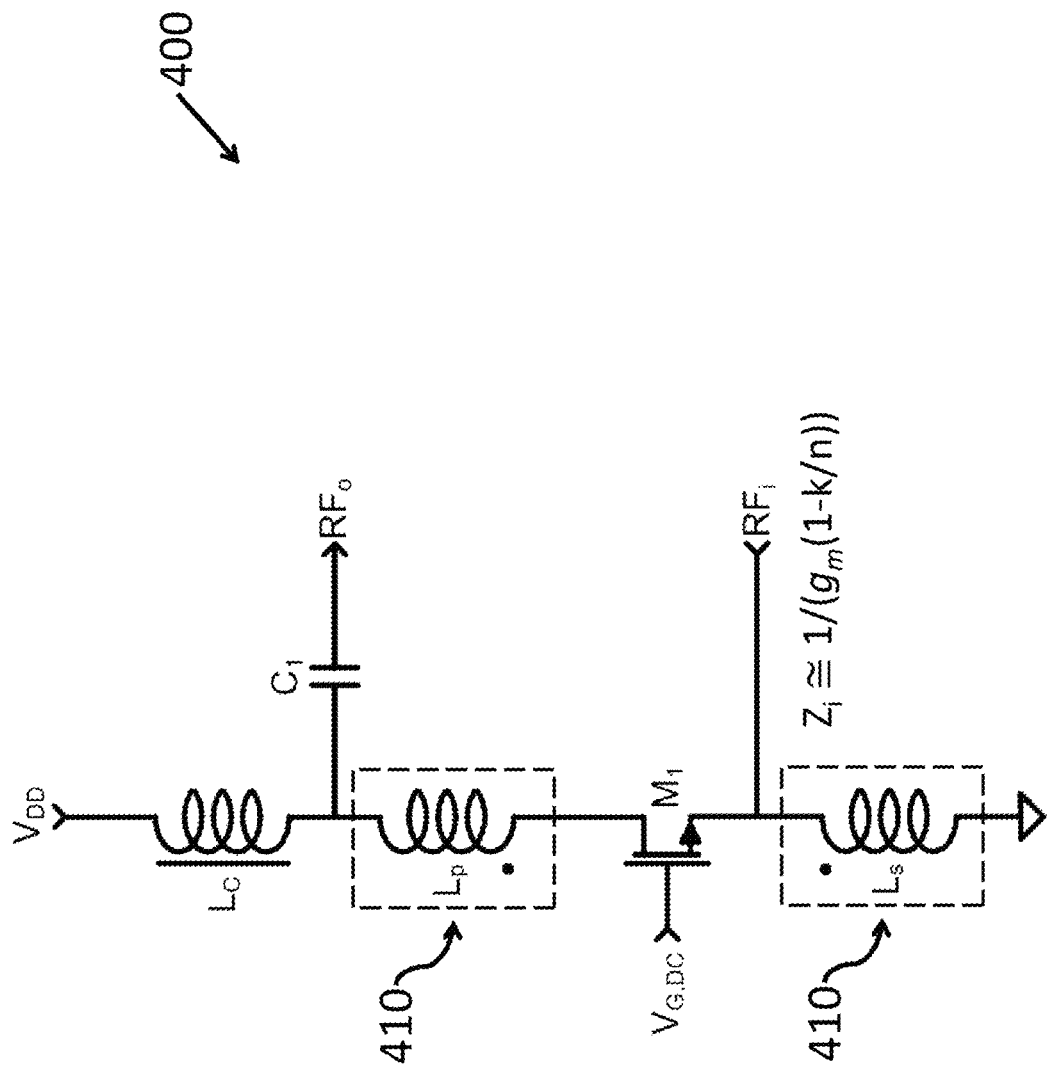
FIG. 4 shows another common-gate LNA using a transformer to boost current gain through reactive positive current feedback.

FIGS. 2 to 4 have already been described above, but briefly these show a basic common-gate LNA circuit (FIG. 2), a modified common-gate LNA with transformer voltage feed-forward gain boosting (FIG. 3) and a modified common-gate LNA with transformer current feedback gain boosting (FIG. 4).

Figure 5:
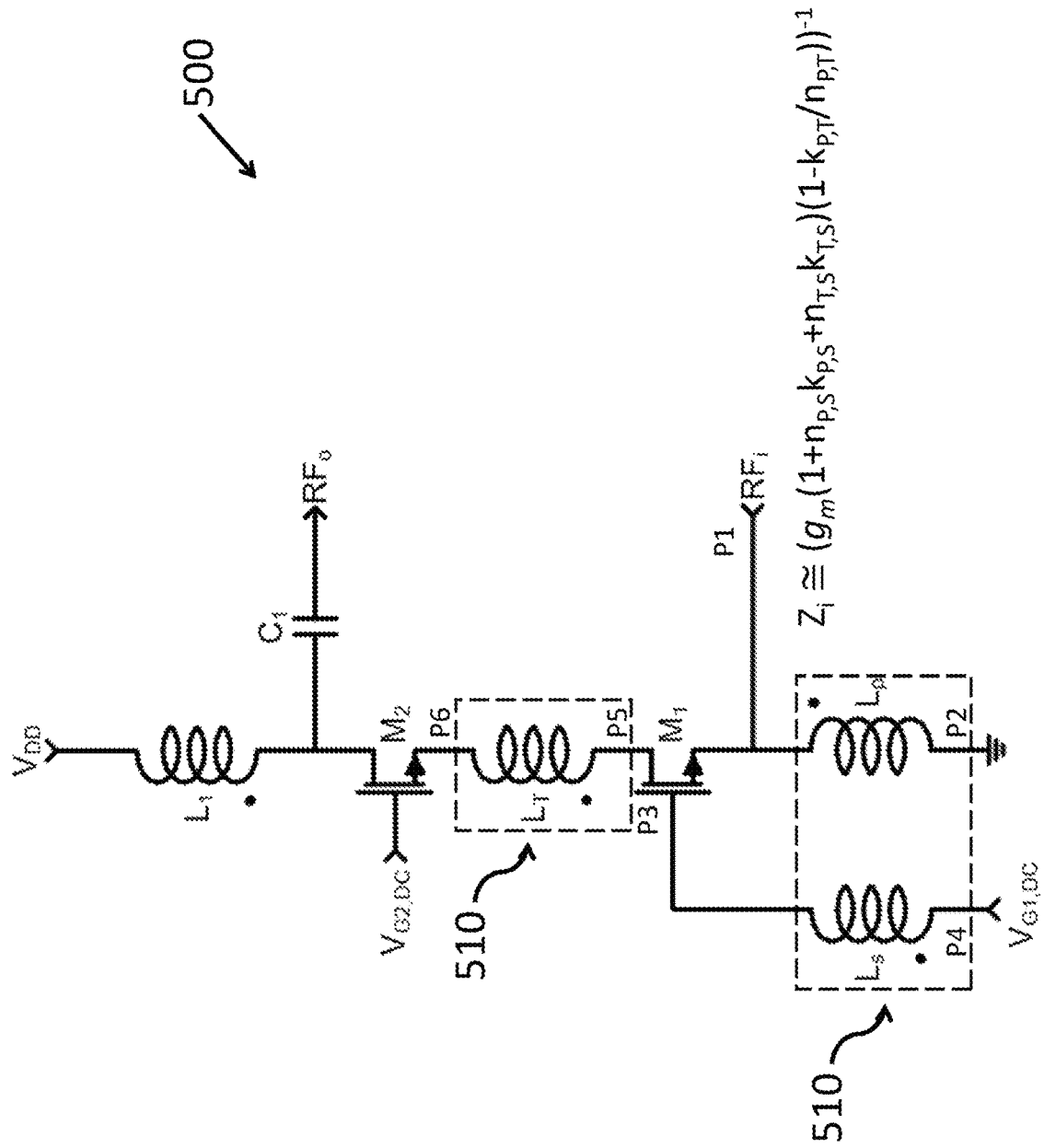
FIG. 5 shows an amplifier according to an embodiment of the invention.

FIG. 5 shows an embodiment of a low-noise amplifier 500 with a trifilar transformer 510 which is made up of a primary winding $L_P$, a secondary winding $L_S$ and a tertiary winding $L_T$. The windings of the trifilar transformer 510 are connected to the terminals of amplifying element $M_1$ which in this embodiment is a Field Effect Transistor (FET). The amplifying element $M_1$ acts as a voltage controlled current source whereby the voltage applied between the first terminal and the third terminal (the gate-source voltage) controls the current flowing between the second terminal (drain) and the third terminal (source).

The transistor $M_1$ is arranged in a common-gate configuration. A DC voltage is applied to the gate (first terminal) to bias the transistor into an active, amplification state. The RF input signal is applied to the source (third terminal) so that it causes variation in the gate-source voltage. The primary transformer winding $L_P$ is connected to the third terminal, i.e. in parallel with the RF input and connects to a ground (this may be an analog ground or it may be a virtual ground e.g. in the case of a differential amplifier).

The secondary winding $L_S$ is connected to the first terminal (gate) in series with the DC bias voltage and in inverting relationship with the primary winding $L_P$. Thus, the primary winding $L_P$ and the secondary winding $L_S$ form a voltage feedforward circuit whereby the primary winding $L_P$ senses the voltage at the input, $RF_i$ and applies it inverted to the gate of $M_1$. Therefore, as the input signal at the source drops, the feedforward of the primary winding $L_P$ and secondary winding $L_S$ causes the gate voltage to increase in proportion to the input signal and vice versa, thus increasing the gate-source voltage and thereby increasing the overall transconductance of the amplifier 500 (i.e. $g_m$-boosting).

The tertiary winding $L_T$ is connected to the second terminal (drain) in non-inverting relationship with the primary winding $L_P$. Thus, the primary winding $L_P$ and the tertiary winding $L_T$ form a positive current feedback loop whereby current sensed at the drain on the tertiary winding $L_T$ is fed back to the primary winding $L_P$ on the source, thereby amplifying the current flow through the current path of the transistor $M_1$ (i.e. drain-source current is amplified).

The output $RF_0$ of amplifier 500 is taken from the other side of the tertiary winding from the amplifying element $M_1$. The output $RF_0$ could be taken directly from the other side of the tertiary winding $L_T$ (i.e. from terminal P6). The ideal load for a current output is 0Ω. In the embodiment of FIG. 5, a current buffer $M_2$ is provided to separate the load (e.g., inductor, $L_1$) on the drain side from the low impedance (i.e., $1/g_m$ of $M_2$) seen at the source. In other embodiments a current choke (i.e., high impedance for RF) arrangement (for DC biasing) such as that shown in FIG. 4 could be used.

The tertiary winding $L_T$ and the secondary winding $L_S$ are also mutually coupled and they are in an inverting relationship. This provides further positive feedback to the gate of $M_1$, which is acceptable (and even beneficial) providing it is kept within boundary conditions. If the magnitude of this tertiary-secondary feedback is too large then the circuit will oscillate and become unstable, and therefore, care needs to be taken to avoid this.

As discussed above, the input impedance of the amplifier 500 is defined as:

$$Z_i \cong \frac{1}{\left(g_m(1 + n_{P,S}k_{P,S} + n_{T,S}k_{T,S})\left(1 - \frac{k_{T,P}}{n_{T,P}}\right)\right)}$$

Therefore, the input impedance can be controlled, and thus matched to other circuit elements, such as an RF antenna for maximum power transfer to the amplifier, by controlling (i.e. appropriately designing) the turns ratios and the mutual coupling coefficients of the three transformer windings. As the impedance matching can be achieved through appropriate design of the transformer windings rather than by requiring an amplifier with a particular intrinsic transconductance or limiting the gain, the circuit provides an improvement over the amplifiers of FIGS. 3 and 4. The amplifier 500 can achieve both impedance matching and high gain without requiring an amplifier with high transconductance and correspondingly high power consumption.

One way to avoid oscillation and instability due to the mutual coupling and feedback of the secondary winding $L_S$ and the tertiary winding $L_T$ is to reduce the coupling coefficient of these two windings by transformer design. One example of a suitable transformer design that can be used with the amplifier 500 of FIG. 5 is shown in FIG. 6.

Figure 6:
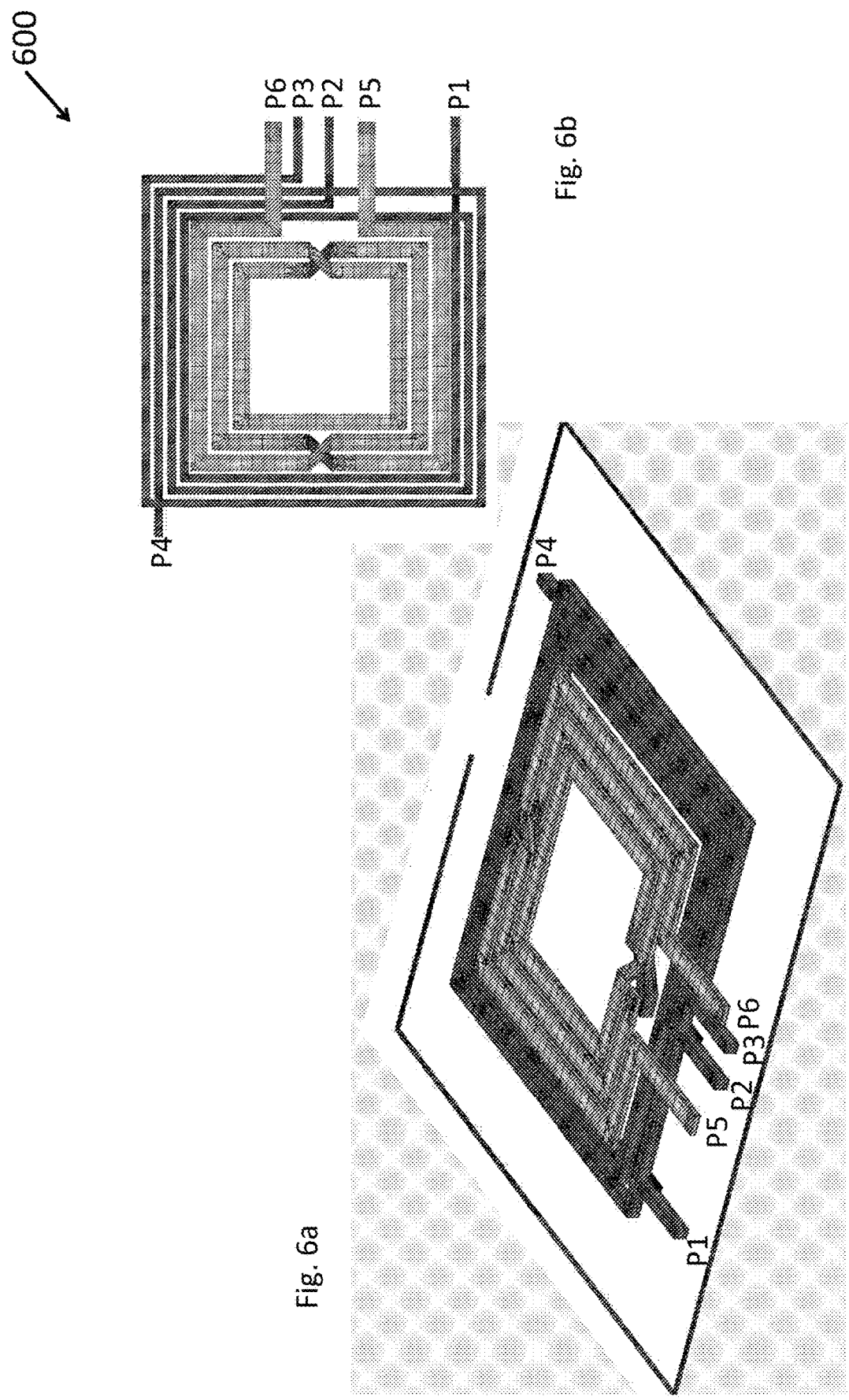
FIGS. 6a and 6b show an example of a transformer layout.

FIG. 6 shows a trifilar transformer 600 which is formed in two separate (stacked) metal layers of a die. The primary winding, the secondary winding and the tertiary winding are all formed as concentric windings (i.e. although the layers are stacked, no winding is directly stacked above another). The primary winding and the secondary winding are formed in one metal layer while the tertiary winding is formed in a second metal layer. The primary winding P1-P2 is the middle winding (in terms of radius) with the secondary winding P3-P4 formed around it (with larger radius) and the tertiary winding P5-P6 formed inside it (with smaller radius).

FIG. 6a shows an isometric projection of the transformer 600 arrangement, while FIG. 6b shows a plan view showing the concentric coils.

The connections to the three windings P1-P6 are also labeled on FIG. 5 to show how the trifilar transformer 600 of FIG. 6 is used to construct the circuit of FIG. 5.

One example of a transformer design in a 55 nm CMOS process is as follows:

Transistor biased with 2.3 mA $I_{DC}$ to provide an intrinsic $g_m$=25 mA/V $L_P$=0.85 nH, $L_S$=0.65 nH and $L_T$=0.9 nH $n_{P,S}$=0.87, $n_{T,S}$=0.85 and $n_{T,P}$=0.95

$k_{P,S}$=0.6, $k_{T,S}$=0.33 and $k_{T,P}$=0.5

From these numbers, the gain, and input impedance, $Z_i$ can be calculated as:

$Z_i \approx 47\Omega$

Using the same design, except with $k_{T,S}=0$ (i.e. with the tertiary-secondary coupling coefficient reduced to zero):

$Z_i \approx 56\Omega$

Thus in both cases the input impedance is well-matched to a 50Ω antenna and the amplifier has high gain.

Figure 7:
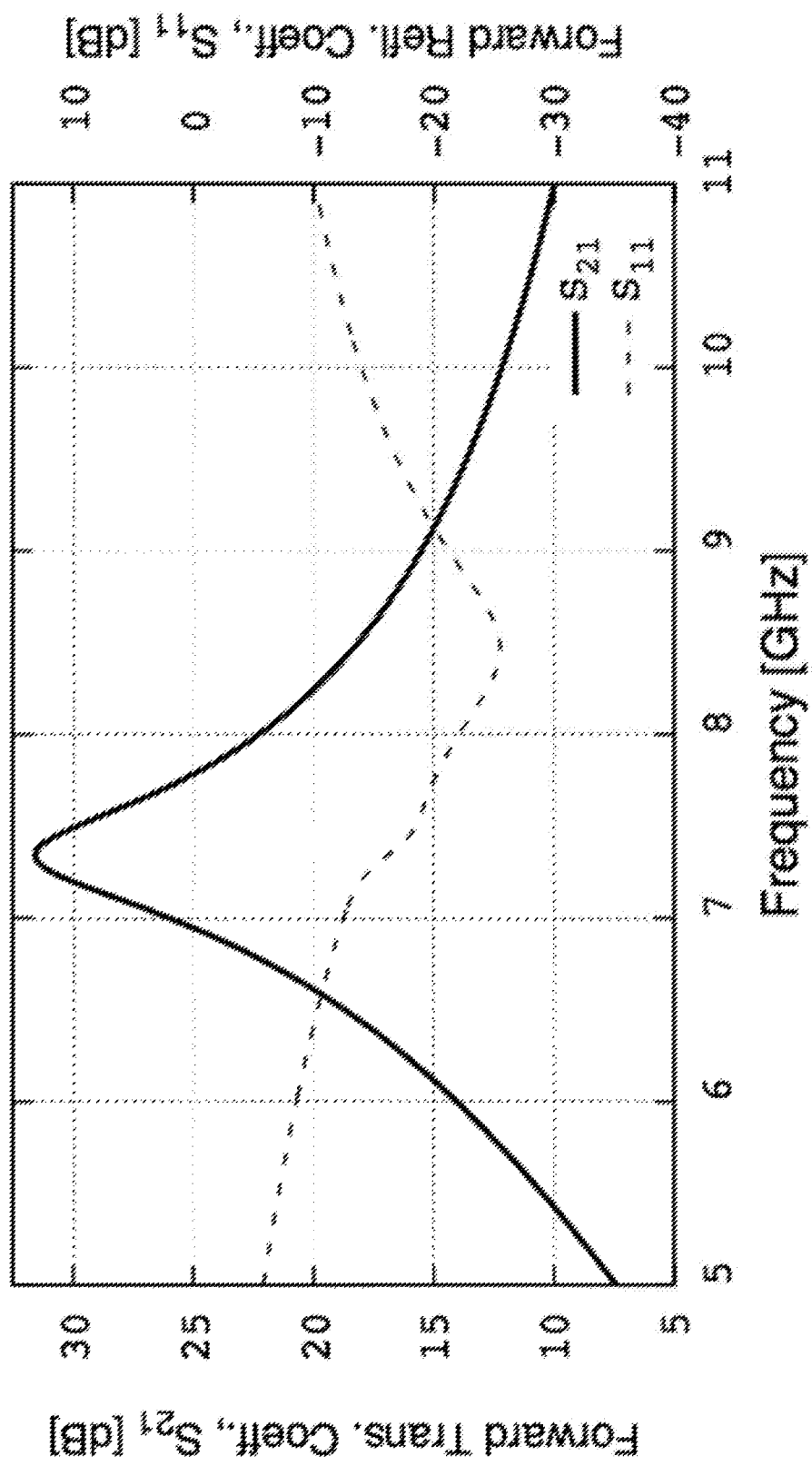
FIG. 7 shows some properties of the amplifier of FIG. 5.

FIG. 7 shows the forward reflection coefficient (return loss) $S_{11}$ and the forward transmission coefficient $S_{21}$ for an embodiment of the amplifier 500 of FIG. 5 in 55 nm CMOS. The forward reflection coefficient $S_{11}$ shows that the amplifier can be considered impedance matched (below −10 dB) across a wide frequency range from around 6.5 GHz to 11 GHz. This is an excellent wideband response suitable for use with ultra-wideband (UWB) applications. The forward transmission coefficient $S_{21}$ shows an excellent signal response, peaking above 30 dB at about 7.3 GHz. The peak response of the amplifier can be tuned in frequency by appropriate choice of the load inductance and capacitance (actual or parasitic), therein forming a parallel LC resonant circuit. The Q-factor of the LC resonant circuit determines the frequency selectivity (bandwidth) of the LNA.

It will be appreciated that variations and modifications of the above circuits may be made without departing from the scope of the appended claims.

The invention claimed is:

1. An amplifier, comprising:
   an amplifying element, having a voltage input across a first terminal and a third terminal and a voltage controlled current path between a second terminal and the third terminal; and
   a trifilar transformer having a primary winding, a secondary winding and a tertiary winding;
   wherein the primary winding is connected to the third terminal, the secondary winding is connected to the first terminal and the tertiary winding is connected to the second terminal;
   wherein the primary winding and the secondary winding are mutually coupled in inverting relationship;
   wherein the primary winding and the tertiary winding are mutually coupled in non-inverting relationship;
   wherein the secondary winding and the tertiary winding are mutually coupled in inverting relationship; and
   wherein the tertiary winding is between the amplifier output and the second terminal.

2. An amplifier as claimed in claim 1, wherein the effective turns ratios of each pair of windings is selected such that the real part of the amplifier input impedance is positive and the real part of the amplifier output impedance is positive.

3. An amplifier as claimed in claim 1, wherein the effective turns ratios of each pair of windings is selected such that the phase difference between the first terminal and the third terminal is within a range of 120-240 degrees.

4. An amplifier as claimed in claim 1, wherein the effective turns ratios of each pair of windings is selected such that the phase difference between the first terminal and the third terminal is within a range of 150-210 degrees.

5. An amplifier as claimed in claim 1, wherein the primary winding, the secondary winding and the tertiary winding are all concentric and wherein the primary winding separates the secondary winding from the tertiary winding.

6. An amplifier as claimed in claim 1, wherein the primary winding is interwound with either the secondary winding or the tertiary winding.

7. An amplifier as claimed in claim 6, wherein the other of the secondary winding and the tertiary winding is concentric with the interwound windings.

8. An amplifier as claimed in claim 1, wherein the trifilar transformer is a stacked transformer formed in two metal layers with the primary winding stacked with one of the secondary winding and the tertiary winding and the primary winding being formed in the same layer and concentric with the other of the secondary winding and the tertiary winding.

9. An amplifier as claimed in claim 1, wherein the secondary winding is shaped so as to have near-zero mutual coupling with the tertiary winding.

10. An amplifier as claimed in claim 1, wherein the amplifying element is a transistor.

11. An amplifier as claimed in claim 10, wherein the transistor is a FET, preferably a MOSFET.

12. An amplifier as claimed in claim 11, wherein the FET is arranged in a common-gate configuration.

13. An amplifier as claimed in claim 12, wherein the primary winding is connected to the FET's source, the secondary winding is connected to the FET's gate and the tertiary winding is connected to the FET's drain.

14. A method of amplifying a signal with an amplifying element, the amplifying element comprising a voltage input across a first terminal and a third terminal and comprising a voltage controlled current path between a second terminal and the third terminal, the method comprising:
   applying the signal to a third terminal of the amplifying element;
   sensing, with a primary winding of a trifilar transformer, a voltage at the third terminal;
   coupling with inversion at least a part of said sensed voltage from the third terminal via a secondary winding of the trifilar transformer to the first terminal of the amplifying element;
   sensing, with a tertiary winding of a trifilar transformer, a current at the second terminal;
   coupling without inversion at least a part of said sensed current from the second terminal via a tertiary winding of the trifilar transformer to the third terminal of the amplifying element; and
   outputting an amplified signal from an output node located such that the tertiary winding is between the output node and second terminal.

* * * * *